(12) United States Patent
Parvizi et al.

(10) Patent No.: US 12,627,263 B1
(45) Date of Patent: May 12, 2026

(54) SYSTEMS AND METHODS FOR LOW VOLTAGE AND LOW POWER TRANSIMPEDANCE AMPLIFIER (TIA) DESIGN

(71) Applicant: Cisco Technology, Inc., San Jose, CA (US)

(72) Inventors: Mahdi Parvizi, Ontario (CA); Toshira Omori, Weston, MA (US); Bahar Jalali Farahani, Princeton, NJ (US); Ricardo Aroca, Jersey City, NJ (US)

(73) Assignee: Cisco Technology, Inc., San Jose, CA (US)

( * ) Notice: Subject to any disclaimer, the term of this patent is extended or adjusted under 35 U.S.C. 154(b) by 592 days.

(21) Appl. No.: 18/105,086

(22) Filed: Feb. 2, 2023

(51) Int. Cl.
*H03F 1/02* (2006.01)
*H03F 3/45* (2006.01)

(52) U.S. Cl.
CPC ....... *H03F 1/0211* (2013.01); *H03F 3/45475* (2013.01); *H03F 2200/451* (2013.01)

(58) Field of Classification Search
CPC ............... H03F 1/0211; H03F 3/45475; H03F 2200/451

USPC .................................. 330/59, 252, 303, 308
See application file for complete search history.

(56) References Cited

U.S. PATENT DOCUMENTS 11,394,349 B2 * 7/2022 Sugimoto ............ H03G 3/3084

* cited by examiner

Primary Examiner — Andrea Lindgren Baltzell
Assistant Examiner — Nareh Shamiryan
(74) Attorney, Agent, or Firm — Patterson + Sheridan, LLP

(57) ABSTRACT

In part, exemplary systems and methods are disclosed for maintaining low voltage and low power in a transimpedance amplifier (TIA). One system includes a sensor (e.g., a photodetector); the TIA; and a dummy TIA. The TIA includes a front end stage, a detector, and a back end stage. In some embodiments, the front end stage is configured to receive a current output from the sensor. In many embodiments, a reading of the detector is used to monitor the current output from the sensor. The back end stage is configured to convert the current to an output voltage in various embodiments. The dummy TIA is coupled to the sensor and diverts the current output from the sensor when the current exceeds a predetermined threshold in some embodiments.

20 Claims, 6 Drawing Sheets

SYSTEMS AND METHODS FOR LOW VOLTAGE AND LOW POWER TRANSIMPEDANCE AMPLIFIER (TIA) DESIGN

FIELD

This disclosure relates generally to the field of communications and transimpedance amplifiers (TIA).

BACKGROUND

Contemporary telecommunications systems make extensive use of integrated circuits that are advantageously mass-produced in various configurations for various purposes.

SUMMARY

In part, in one aspect, the disclosure relates to a system for maintaining low voltage and low power in a transimpedance amplifier (TIA). In some embodiments, the system includes a sensor (e.g., a photodetector), the TIA (also referred to as "main TIA"), and a dummy TIA. In various embodiments, the main TIA includes a front end stage, a detector, and a back end stage. In some embodiments, the front end stage is configured to receive a current output from the sensor. A reading of the detector is used to monitor the current output from the sensor. In some embodiments, the back end stage is configured to convert the current to an output voltage. In various embodiments, the dummy TIA coupled to the sensor and diverts the current output from the sensor when the current exceeds a predetermined threshold.

In some embodiments, the detector includes a received signal strength indicator (RSSI). In various embodiments, the RSSI may be coupled to the front end stage of the main TIA. In some aspects, the current output from the sensor may exceed the predetermined threshold when the RSSI reading is below a second predetermined threshold. Also or alternatively, the detector may be coupled to the back end stage (e.g., to read an output waveform of the main TIA). For example, the detector may further include one or both of a root mean square (RMS) amplitude detector, or a peak amplitude detector.

In many embodiments, the main TIA further includes a main signal path. The main signal path may transfer the current output from the sensor to the front end stage of the main TIA when the current output from the sensor does not exceed the predetermined threshold. Furthermore, the dummy TIA includes a second front end stage and a current bleeding path in some embodiments. In many embodiments, the current bleeding path may divert the current output from the sensor to the second front end stage when the current output from the sensor exceeds the predetermined threshold.

In many embodiments, the dummy TIA may include a control gain reduction switch coupled to the current bleeding path. In some embodiments, the control gain reduction switch may be digital or analog. In various embodiments, when the current output from the sensor exceeds the predetermined threshold, the control gain reduction switch calibrates an extent of the current diverted to the second front end stage. For example, in some embodiments, the extent of the current diverted may be proportional to an extent that the current output from the sensor exceeds the predetermined threshold. Also or alternatively, the control gain reduction switch may be an n-bit digital control gain reduction switch in some embodiments. In some embodiments, as the extent of the current diverted is proportional to the extent that the current output from the sensor exceeds the predetermined threshold, the extent of the current can be one of n discrete levels (e.g., corresponding to one of the n-bits of the n-bit digital control gain reduction switch). In at least one aspect, the control gain reduction switch can be controlled via a digital to analog converter (DAC).

In various embodiments, for a given amount of current output from the sensor and diverted to each of the main TIA and the dummy TIA, the impedance of the dummy TIA is less than the impedance of the main TIA. Furthermore, for a given amount of current output from the sensor and diverted to each of the main TIA and the dummy TIA, the power consumed by the dummy TIA is less than the power consumed by the main TIA in some embodiments. In some embodiments, the system may further include an automatic gain control (AGC) in electrical communication with the dummy TIA, wherein the main TIA further includes a variable gain amplifier (VGA), the VGA in electrical communication with the front end stage and the back end stage, wherein the VGA is in electrical communication with the AGC, wherein the AGC includes the detector.

In yet another aspect, the disclosure relates to a method for maintaining low voltage and low power in a transimpedance amplifier (TIA). In some embodiments, the method may include: receiving, via a main signal path of the main TIA, a current output from a sensor; converting, by the main TIA, the current output from the sensor to an output voltage; determining that the current output from the sensor is above a predetermined threshold; and diverting, responsive to the current output from the sensor being above the predetermined threshold, the current output from the sensor to a dummy TIA via a current bleeding path coupled to the sensor. In some embodiments, the dummy TIA may further include a control gain reduction switch coupled to the current bleeding path.

In some embodiments, after the current output from the sensor is determined to be above the predetermined threshold, the method may further include calibrating, via the control gain reduction switch, an extent of the current being diverted to the dummy TIA. In some embodiments, the extent of the current being diverted may be proportional to an extent that the current output from the sensor exceeds the predetermined threshold in some embodiments. Also or alternatively, the control gain reduction switch is an n-bit digital control gain reduction switch in some embodiments. In various embodiments, the extent of the current being diverted may thus be discretely proportional to an extent that the current output from the sensor exceeds the predetermined threshold. For example, the extent of the current may be one of n discrete levels (e.g., corresponding to one of the n-bits of the n-bit digital control gain reduction switch).

Although, the disclosure relates to different aspects and embodiments, it is understood that the different aspects and embodiments disclosed herein can be integrated, combined, or used together as a combination system, or in part, as separate components, devices, and systems, as appropriate. Thus, each embodiment disclosed herein can be incorporated in each of the aspects to varying degrees as appropriate for a given implementation. Further, the various apparatus, optical elements, optical paths, waveguides, splitters, couplers, combiners, electro-optical devices, inputs, outputs, ports, channels, sensors, detectors, switches, binary switches, communication channels, controllers, current bleeding paths, controllers, control systems, transimpedance amplifiers and stages thereof, dummy or auxiliary transimpedance amplifiers scaled to a main or primary transimpedance amplifiers, components and parts of the foregoing disclosed herein can be used with any laser, laser-based communication system, waveguide, fiber, transmitter, transceiver, receiver, and other devices and systems without limitation.

These and other features of the applicant's teachings are set forth herein.

BRIEF DESCRIPTION OF THE FIGURES

Unless specified otherwise, the accompanying drawings illustrate aspects of the innovations described herein. Referring to the drawings, wherein like numerals refer to like parts throughout the several views and this specification, several embodiments of presently disclosed principles are illustrated by way of example, and not by way of limitation. The drawings are not intended to be to scale. A more complete understanding of the disclosure may be realized by reference to the accompanying drawings in which.

DETAILED DESCRIPTION

Figure 1:
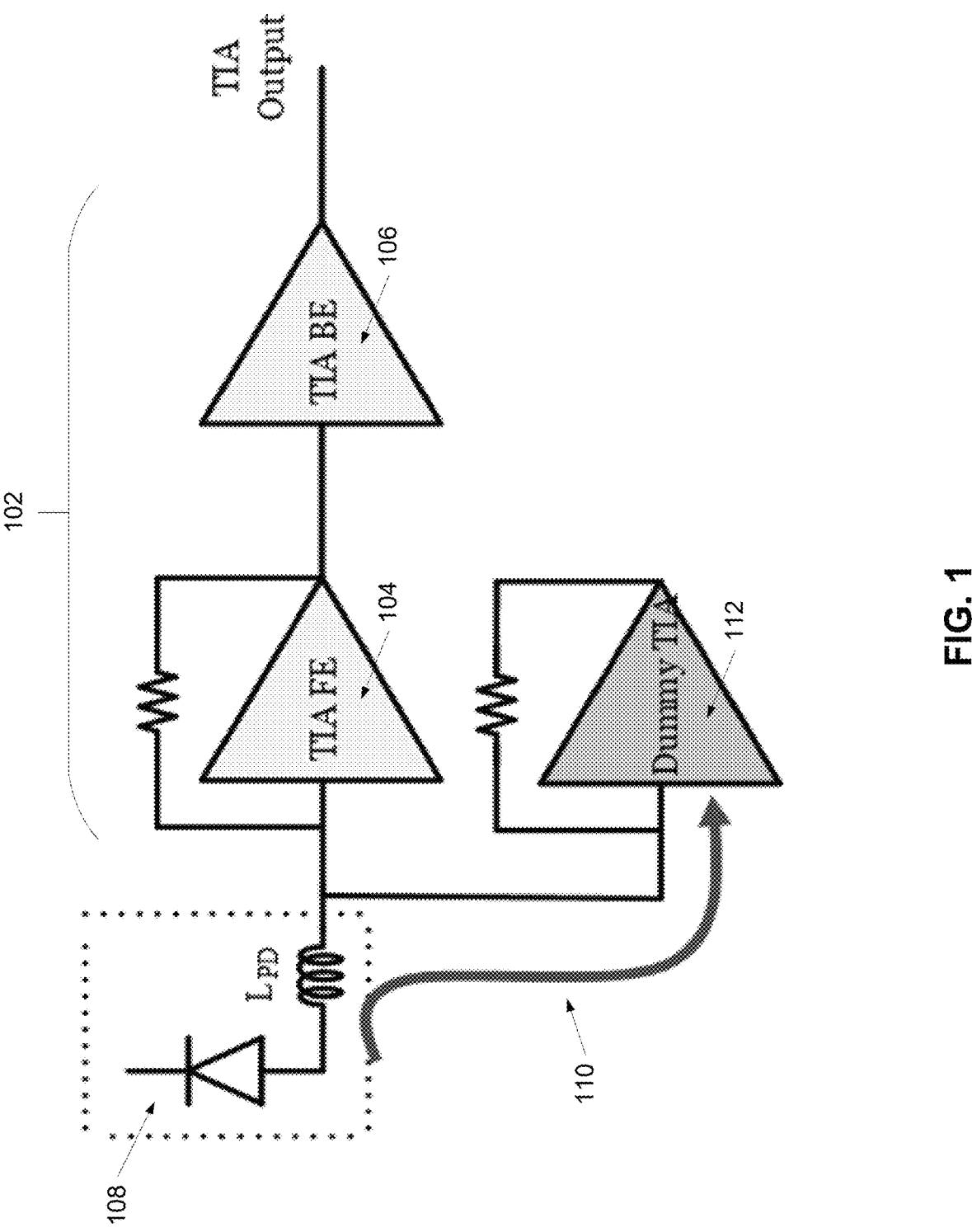
FIG. 1 is a high level schematic of an example system for maintaining low voltage and low power in a main transimpedance amplifier (TIA) using a current bleeding path and a dummy or auxiliary TIA, in accordance with one or more aspects of the disclosure.

Transimpedance amplifiers (TIAs) are a key building block of optoelectronics. Due to a TIA's direct exposure to photo detector and/or other sensors, TIAs may require a relatively large dynamic current range requirement (e.g., due to large fluctuations in photodetection). When the TIA receives large currents as input, non-linearity often results in the outputted voltage. For example, in a typical current range received by the TIA, the maximum current inputted at the TIA typically results in the worst-case linearity for the TIA, especially when the TIA is not capable of handling such high currents. In order to increase the maximum current that a TIA can handle (e.g., to increase the dynamic current range), some conventional TIAs eliminate an optical variable gain attenuator (VOA) on the photonic integrated circuit (PIC) side of the TIA. However, this elimination often results in higher noise in the signals output by the TIA.

In other TIAs, the front-end of the TIA may be designed using a supply voltage high enough to handle high currents.

However, this design leads to power consumption penalties at low input currents, a phenomenon also referred to as a maximum gain condition. There is thus a desire and need for a system, method, and/or technique for maintaining low voltage and low power in a TIA, for example, as it handles large dynamic current ranges. Various system, method, and device embodiments disclosed herein may meet the foregoing needs and other relating to optical communications and TIAs.

In many embodiments, the current disclosure may enable the design, creation, and/or implementation of a system for maintaining low voltage and low power in a transimpedance amplifier (TIA) even as the TIA receives a large dynamic current range. Similarly, various embodiments relate to systems, methods, and devices that mitigate overload current in a main or first TIA by selectively migrating, bleeding or shunting current flow to a replica or dummy TIA. As used herein a given dummy TIA may also be referred to as an auxiliary TIA. A given dummy TIA may include one or more stages. In various embodiments, the main TIA is operated within its normal operating voltage and the dummy TIA or dummy TIA stage connected to the main TIA is used to receive excess current to support or maintain the linear operation of the main TIA or otherwise within a preferred range of operating parameters. In various embodiments, a dummy or auxiliary TIA or a scaled TIA is selected to have an impedance that works well over a given frequency band and such that impedance of the main current path of the main TIA and the impedance of the current bleeding path are matched. In various embodiments, the dummy or auxiliary TIA is configured such that its power consumption is less than the main or primary TIA. In various embodiments, the capacitance, resistance, impedance, attenuation and frequency response of the dummy TIA or individual components or stages thereof are adjusted to match the primary TIA, be greater than the primary TIA, or be less than the primary TIA.

As previously discussed, TIAs typically require a relatively large dynamic current range as they are directly exposed to fluctuating currents generated from photo detectors and/or other sensors. When the TIA receives large currents as input (i.e., during an overload condition), non-linearity often results in the outputted voltage. Conventionally, two approaches have been used in an attempt to address this condition. As the front end stage of the TIA is often the bottleneck for creating linearity between the input current and output voltage of the TIA, one approach is to reduce the front end gain of the TIA. However, this approach often results in a higher TIA noise. Another approach involves increasing the supply voltage for the front end of the TIA to handle large swings in voltage caused by the overload condition with minimal distortion. For example, front end supply voltage may be sufficiently high enough (e.g., above 3 V) to handle the excess voltage caused by the current overload condition. However, this approach results in significantly higher power consumption.

Various embodiments of the present disclosure provide a novel and nonobvious system, process, and technique for maintaining low voltage and low power in a transimpedance amplifier (TIA) across large dynamic current ranges, which overcome and/or mitigate the above described shortcomings associated with conventional approaches. In many embodiments of the present disclosure, the signal path associated with the TIA (also referred to herein as the "main TIA" or primary TIA) is complemented with a current bleeding path associated with a dummy TIA which may be a replica of the primary or main TIA or a scaled version with the same components, but with different operational, physical, or electronic parameters. During an overload condition (e.g., when the main TIA faces an input of current from a photodetector or other sensor that is beyond what the main TIA is capable of handling), the dummy TIA receives the excess current via the current bleeding path. In this way, the excess current bypasses the main TIA and supports it operating within a preferred range of parameters. The dummy TIA is configured to have the same or similar impedance as the main TIA for a given frequency band, and is configured to consume less power.

Refer now to the example embodiment of FIG. 1, which is a high-level schematic of an example system for maintaining low voltage and low power in a transimpedance amplifier (TIA) 102 using a current bleeding path 110, in accordance with one or more aspects of the disclosure. As shown in FIG. 1, the main TIA 102 includes a front end (FE) stage (e.g., TIA FE 104) and a back end (BE) stage (e.g., TIA BE 106). The front end stage 104 directly interfaces with a sensor 108 (e.g., photodetector (e.g., shown as a diode)) to receive, as input, current output from the sensor 108. The current received at the sensor may correspond to telecom data optically transmitted to and received by the sensor. The back end stage 106 converts the current into an output voltage (e.g., TIA output). As shown in FIG. 1, the technique involves diverting current through a current bleeding path 110 into a dummy TIA 112, when the current exceeds a predetermined threshold. In various embodiments, a given dummy TIA may be a replica or copy or partial replica or a partial copy of the main TIA. For example, in some embodiments, a dummy TIA may include the same or approximately the same components of the main TIA. In other embodiments, the dummy TIA is a scaled or partial version of the main TIA.

In some embodiments, the current bleeding path 110 and/or the dummy TIA 112 is selectively activated at high currents to allow the current (e.g., the radiofrequency (RF) current output from the sensor 108) to bleed into the dummy TIA 112. Hence, the swing in voltage at the TIA output may not go beyond a required threshold, thereby maintaining the linearity of the TIA 102. The current bleeding path 110 and dummy TIA 112 may function as an attenuator at the input of the main TIA 102 when the current output from the sensor 108 is high and hence the TIA gain is very low. Thus, the noise contribution of the main TIA may be very low, and it may not degrade the performance of the TIA 102 and/or any associated electronics system. One or more switches, detectors, or other devices may be used to respond to the current value at the sensor 108 and respond by bleeding current to the dummy TIA 112 when certain threshold currents are reached.

Figure 2A:
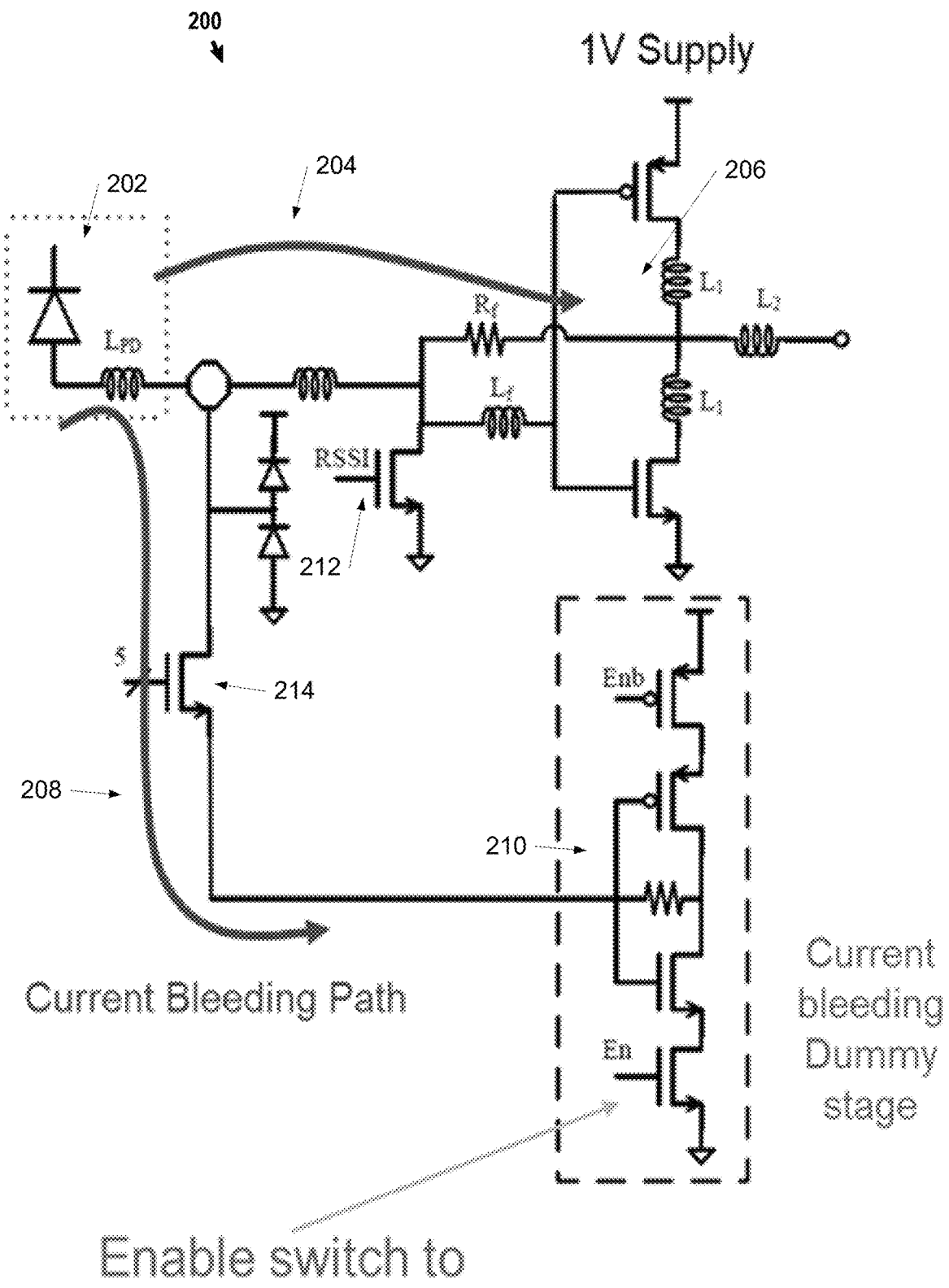
FIG. 2A is a high level circuit diagram of an example system for maintaining low voltage and low power in a main transimpedance amplifier (TIA) using a current bleeding path and a dummy or auxiliary TIA, in accordance with one or more aspects of the disclosure.

Refer now to the example embodiment of FIG. 2A, which is a high level circuit diagram of an example system 200 for maintaining low voltage and low power in a transimpedance amplifier (TIA) using a current bleeding path, in accordance with one or more aspects of the disclosure. As shown in FIG. 2A, the example system 200 may include a main signal path 204 to conduct current, such as RF current, output from the sensor 202 to the main TIA 206 and a current bleeding path 208 to conduct excess RF current output from the sensor 202 to the dummy TIA 210. The example system 200 may further include a detector 212, which may be used to determine whether or not to activate the dummy TIA 210 and/or the current bleeding path 208. In various embodiments, a given detector is in electrical communication with the sensor 202 and or the TIA 206. In various embodiments, a control device or switch 214 such as a control gain reduction switch or other switching device regulates the flow of current to the dummy TIA 210 in response to the detection of excess current using detector 212 and/or signals received directly from sensor 202.

For example, as shown in FIG. 2A, the detector 212 may include a received signal strength indicator (RSSI) that may measure or determine a signal strength that is correlative or based on the current output from the sensor 202. Various detectors 212 for measuring current or other signal data may be used without limitation. The RF current may proceed through the main TIA path 204 while the RSSI reading is below a given threshold. However, once the RSSI reading goes beyond a calibrated limit, the dummy TIA 210 may be activated, allowing excess current (e.g., RF current output from the sensor 202 that is above a predetermined threshold) to flow into the current bleeding path 208. In some embodiments, the bleeding path gain may be calibrated. For example, a switch or controller 214 such as a control gain switch may allow flow of current into the current bleeding path 208 to be specified at a partial current level or a maximum possible current level. In various embodiments, the control gain switch digital controls or adjusts the current flow into the bleeding path. This bleeding path draws the extra RF current coming from the sensor 202 such as a photodiode and does not let the main TIA 206 become saturated. This leads to significant power saving in the system 200. In some embodiments, the detector 212 is an analog device and in other embodiments the detector is a digital device or a combination thereof. In various embodiments, the detector 212 may include a digital to analog converter (DAC).

Figure 2B:
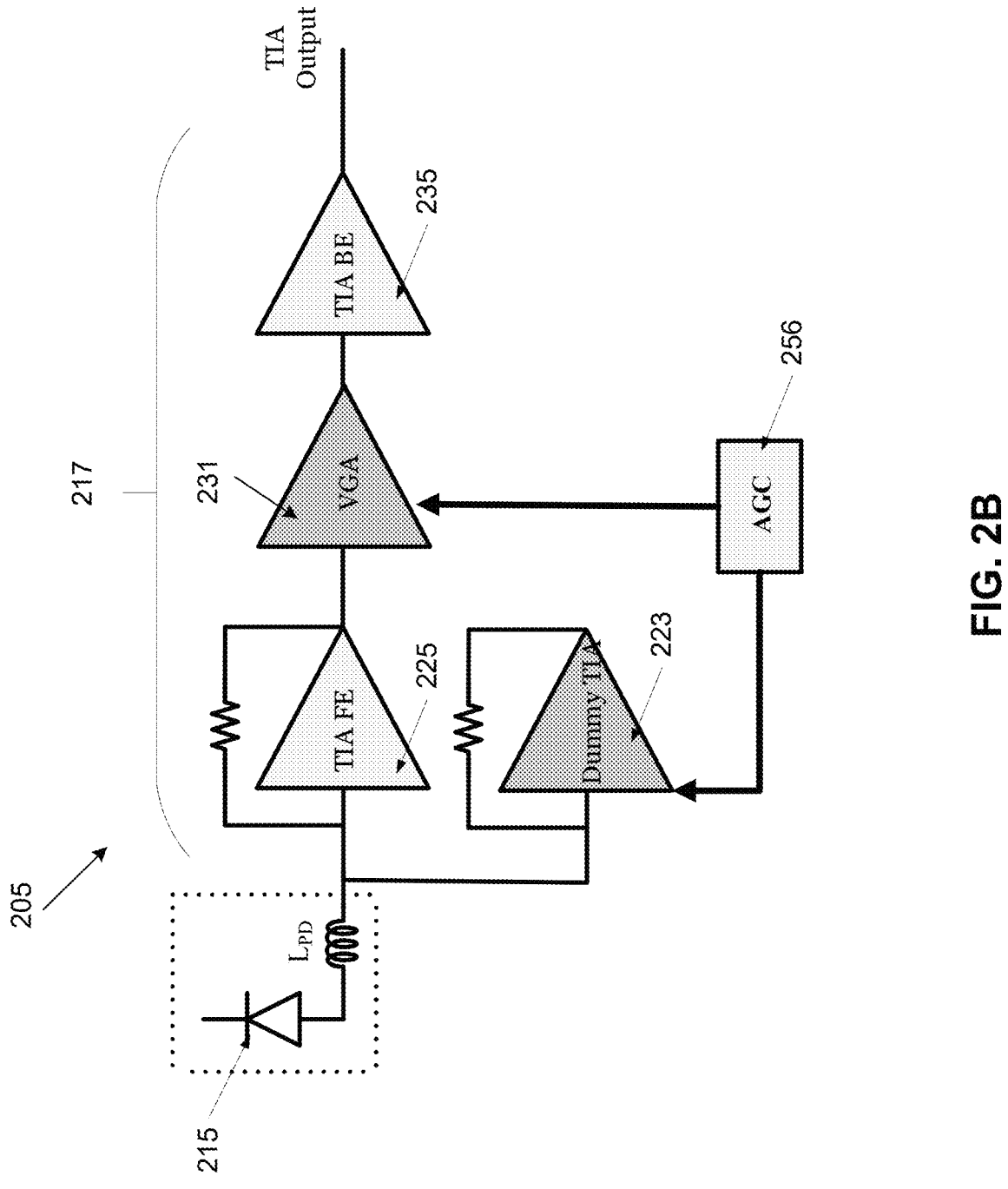
FIG. 2B is a high level circuit diagram of an example system for maintaining low voltage and low power in a main transimpedance amplifier (TIA) using a current bleeding path and a dummy or auxiliary TIA and a variable gain amplifier and an automatic gain control, in accordance with one or more aspects of the disclosure.

Refer now to the example embodiment of FIG. 2B, which is a high level circuit diagram of an example system 205 for maintaining low voltage and low power in a main transimpedance amplifier (TIA) that includes a variable gain amplifier (VGA). As shown in FIG. 2B, the main TIA 217 includes a front end (FE) stage (e.g., TIA FE 225), a variable gain amplifier (VGA) 231, and a back end (BE) stage (e.g., TIA BE 235). The front end stage 225 directly interfaces with a sensor 215 (e.g., photodetector (e.g., shown as a diode)) to receive, as input, current output from the sensor 215. The current received at the sensor may correspond to telecom data optically transmitted to and received by the sensor. The back end stage 235 converts the current into an output voltage (e.g., TIA output). In various embodiments, the VGA 231 is in electrical communication with the TIA FE 225 and the TIA BE 235 of the main TIA 217. In various embodiments, the VGA 231 is in electrical communication with an automatic gain control (AGC) 256. The AGC 256 may be in electrical communication with the dummy TIA 223 in some embodiments. In various embodiments, the AGC may include one or more detectors suitable for detecting changes in output current from the sensor 215 and in turn causing the dummy TIA to receive a portion of the output current as part of a bleeding path to improve the operation of the main TIA.

As shown in FIG. 2B, the example system 205 may include a main signal path to conduct current, such as RF current, output from a sensor 215 to the main TIA 217 and a current bleeding path to conduct excess RF current output from the sensor 215 to the dummy TIA 223. In various embodiments, the current flow to the dummy TIA to safeguard the main TIA 217 may be controlled using the same control voltage from AGC 256 that controls the VGA 231 of the main TIA 217. As a result, in some embodiments, the control loop for the variable gain of the main TIA and the control of the current flow to the dummy TIA may all be controlled by voltages or other signals sent from and/or specified with regard to the AGC 256 as part of one control loop. In various embodiments, the dummy TIA 223 will bleed the current from the sensor 215 at the input to the dummy TIA 223 as needed to avoid the saturation in the main path in communication with the main TIA 217. In various embodiments, the current flowing to the dummy TIA 223 may be controlled using an analog voltage or other control from the AGC 256.

Figure 3:
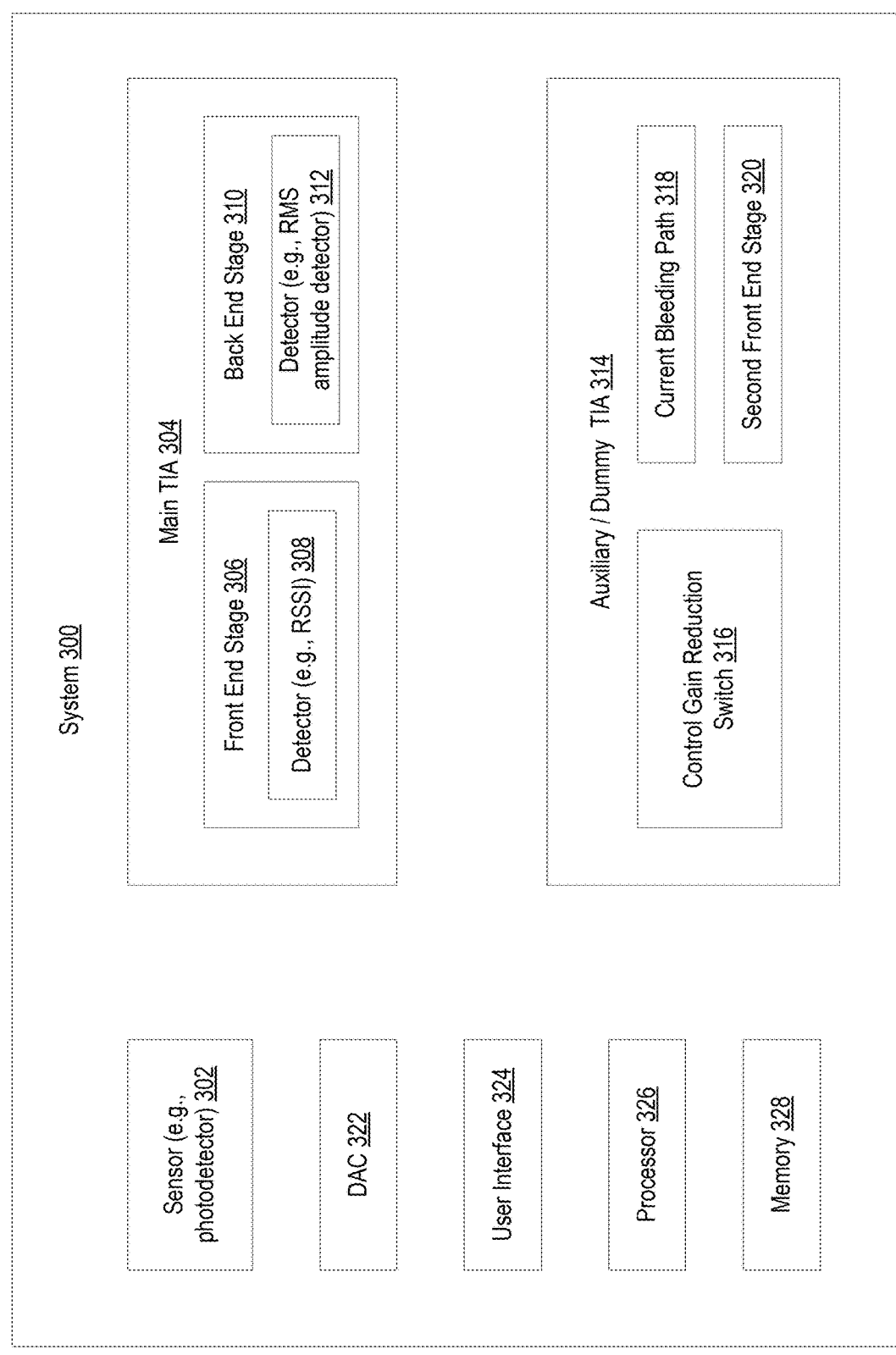
FIG. 3 is a component diagram of an example system for maintaining low voltage and low power in a main transimpedance amplifier (TIA), in accordance with an embodiment of the disclosure.

Refer now to FIG. 3, which is a component diagram of an example system 300 for maintaining low voltage and low power in a transimpedance amplifier (TIA), in accordance with an embodiment of the disclosure. As shown in FIG. 3, the system 300 may include a sensor 302 (e.g., as in sensor 108, 202), a main TIA 304 (e.g., as in main TIA 102), and a dummy TIA 314 (e.g., as in dummy TIA 112, 210). In some embodiments, the system 300 may further include a DAC 322, a user interface 324, a processor 326, and a memory 328.

The sensor 302 may include a photodetector (e.g., a photodiode) or a detector of another electromagnetic radiation that may convert photonic energy associated with the radiation to a current. Depending on the level of incoming radiation (e.g., light) at the sensor, the current being output may fluctuate. The main TIA 304 may include a default destination for the current output from the sensor 302, for example, when the current range is within what the main TIA 304 is capable of handling (e.g., when the current received from the sensor does not place the main TIA in an overload condition). The capability may be determined based on, for example, a tolerance level for noise of the resulting TIA output signal, a tolerance level for nonlinearity of the resulting TIA output signal. The main TIA 304 may include a front end stage 306 and a back end stage 310. As previously discussed (e.g., in relation to front end stage 104 and back end stage 106), the front end stage 310 may directly interface with the sensor 302 to receive the current output from the sensor 108, whereas the back end stage 106 may convert the current into an output voltage.

The main TIA 304 may include one or more detectors that may be used to measure, determine, or deduce the current output from the sensor (e.g., to identify or predict when the main TIA 304 is in an overload condition). For example, the front end stage 306 may include a detector 308 to directly measure a characteristic or value of the received current. In at least one embodiments, the detector 308 may include a received signal strength indicator (RSSI) that can measure a power of the received current output from the sensor (e.g., based on a photodetection). Based on a known voltage (e.g., a supply voltage), a value or measurement of the current output from the sensor may be determined from the power. Also or alternatively, the current output from the sensor may be determined using detector at the back end stage 310 (e.g., detector 312). For example, a root mean square (RMS) amplitude detector or a peak amplitude detector may be used to detect characteristics of the output waveform of the main TIA (e.g., e.g., the voltage waveform), to deduce or determine a measured current output from the sensor.

The dummy TIA 314 may be an alternate destination for at least a portion of the current output from the sensor 302 (e.g., during an overload condition). The dummy TIA 314 and associated circuitry (e.g., current bleeding path 110, 208 linking the sensor 302 to the dummy TIA 314) may be activated based on the detector readings (e.g., RSSI, RMS amplitude detector, signal property detector, and/or peak amplitude detector, etc.). For example, if the detector reading is higher than a predetermined threshold, or a determined value of the current output from the sensor 302 is higher than predetermined threshold, the dummy TIA 314 and its associated circuitry may be activated. In some embodiments, the dummy TIA 314 may be a scaled down version of the main TIA 304, and may thus include one or more similar components. For example, the dummy TIA 314 may include a second front end stage 320 that may be configured to directly interface with the sensor 302 to receive, as input, excess current output from the sensor 302 via a current bleeding path 318. In some aspects, the dummy TIA 314 may further include a control gain reduction switch 316 configured to control (e.g., by calibrating or adjusting) the gain within the current bleeding path after it has been activated (e.g., based on the detector readings) or more generally control the level of current directed along a conductive path to the dummy/ auxiliary TIA. The control gain reduction switch 316 may be analog and/or digital.

For example, the system 300 may include a digital to analog converter 322 to control the gain to the current bleeding path via the digital control gain reduction switch 316 (e.g., based on digital signals resulting from user input via a user interface 324). Also or alternatively, the control gain reduction switch may be an n-bit digital control gain reduction switch, where the portion of the current output from the sensor that is diverted to the dummy TIA (e.g., via the current bleeding path) may be discretely proportional to an extent that the current output from the sensor exceeds the predetermined threshold.

In some embodiments, the system 300 may include a circuit, an ASIC, a computing system or an embedded system causing one or above described components of the improved TIA (e.g., including the main TIA 304 and dummy TIA 314) to be controllable and/or configurable based on computer executable or machine readable instructions stored in a memory (e.g., memory 328). Furthermore, such instructions may include, or may be adjusted, based on user input received via the user interface 324. For example, a user may wish to control how much current should flow into the current bleeding path by dialing up or dialing down the control gain reduction switch 316, and/or may set thresholds for when the dummy TIA 314 is activated based on detector readings. Thus, the system 300 may further include a processor 326 and a memory 328. The processor 326 may include any one or more types of digital circuit configured to perform operations on a data stream, including functions described in the present disclosure. The memory 328 may include any type of long term, short term, volatile, nonvolatile, or other memory and is not to be limited to any particular type of memory or number of memories, or type of media upon which memory is stored. Furthermore, the memory 328 may store computer-executable instructions that, when executed by the processor 326, can cause the processor 326 to perform one or more processes described herein.

Figure 4:
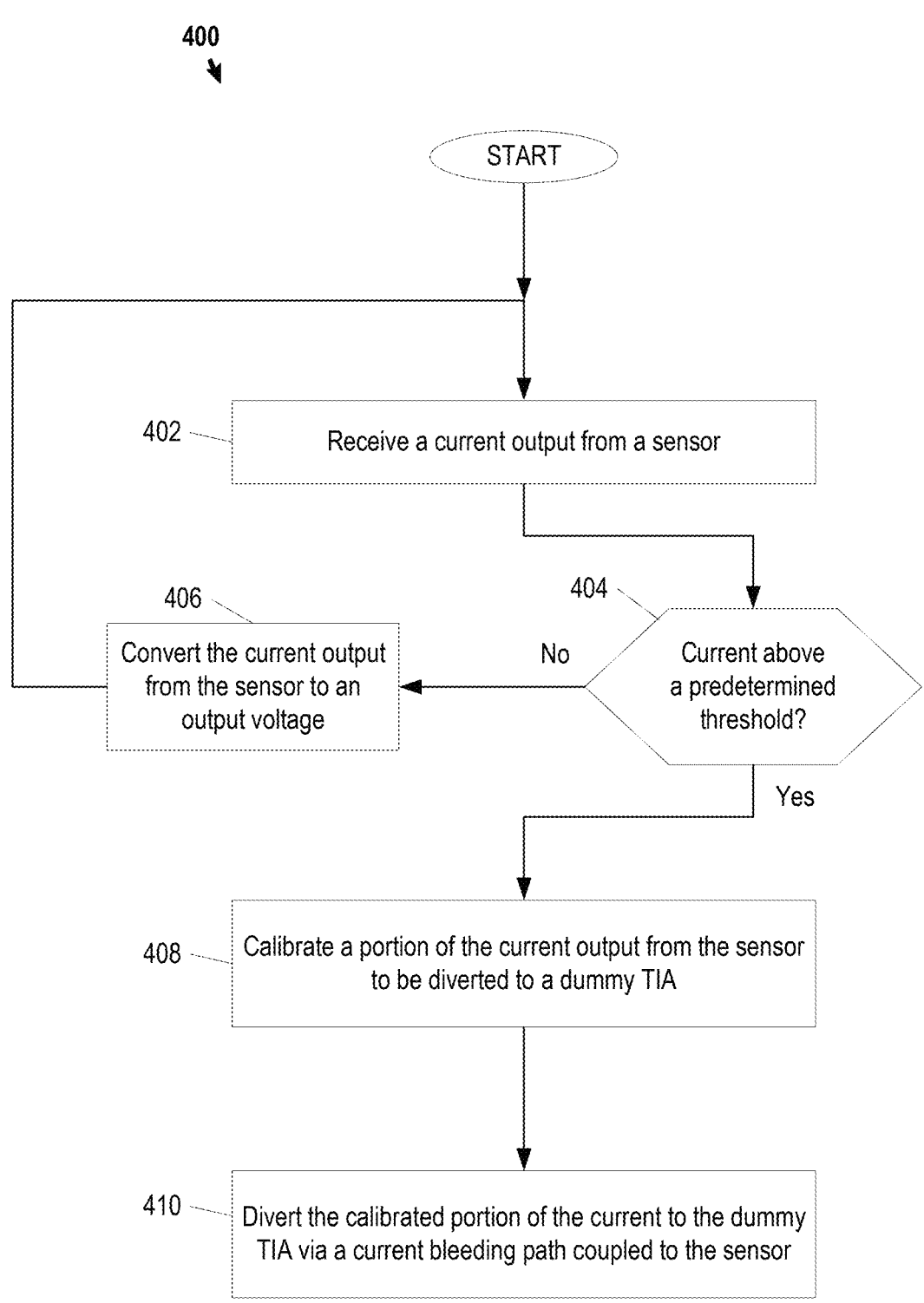
FIG. 4 is a flow chart illustrating an example process for maintaining low voltage and low power in a transimpedance amplifier (TIA), in accordance with one or more aspects of the disclosure.

Refer now to the example embodiment of FIG. 4, which is a flow chart illustrating an example process 400 for maintaining low voltage and low power in a transimpedance amplifier (TIA), in accordance with one or more aspects of the disclosure. In some embodiments, one or more steps or blocks of process 400 may be performed by a circuit, a controller, a photonic integrated circuit, a control system, an ASIC, a processor based on computer-executable or machine-executable instructions stored in a memory and combinations thereof. For example, as discussed in relation to FIG. 3, various aspects of the main TIA, the dummy TIA, and/or associated circuitry may be controlled by a computing system and/or embedded system (e.g., system 300)

having a processor (e.g., processor 326) and a memory (e.g., memory 328). Also or alternatively, one or more steps or blocks of process 400 may be performed by the system based on the design of the system, as described herein. For ease of explanation, system 300 may be used to refer to any of the above described performer of the steps and/or blocks of FIG. 4.

Process 400 may begin with the system receiving a current output from a sensor (block 402). The sensor (e.g., sensor 108, 202, 302) may be a photodetector or a detector of another electromagnetic radiation that may convert photonic energy associated with the radiation to a current. Depending on the incoming radiation (e.g., light) at the sensor, the current being output may fluctuate. Block 402 may be based on an instant measurement of a current output from the sensor, as part of a stream of measurements of current output from the sensor, for example, at predetermined intervals.

At block 404, the system may determine whether the measured current is above a predetermined threshold. In some aspects, the threshold may be programmed (e.g., by an operator of the system), for example, based on preexisting knowledge of what a given TIA (e.g., main TIA 102, 304) is capable of handling while maintaining a certain noise level and/or linearity). In some embodiments, as will be discussed, there may be multiple graded thresholds, for example, which may determine how much of the current is to be diverted to the dummy TIA. The current output from the sensor 302 may be measured and/or its amperage may be determined via a detector. For example a detector 308 such as a received signal strength indicator (RSSI) may be used by the main TIA 304 to measure a power of the received current output from the sensor (e.g., based on a photodetection). Based on a known voltage (e.g., a supply voltage), a value or measurement of the current output from the sensor may be determined from the power. Also or alternatively, the detector may detect an output of the main TIA (e.g., detector 312), to deduce or determine a measured current output from the sensor.

If the current is not found to be above the predetermined threshold, the system may convert the current output from the sensor to an output voltage (e.g., in accordance with the functionalities associated with the main TIA 102, 304) (block 406). For example, the entirety of the current may flow through the main signal line 204 through the TIA front end 104 and TIA back end 106 of the main TIA 102, 304, and may be output as a voltage.

If the current is found to be above the predetermined threshold, the system may calibrate a portion (e.g., an extent) of the current output from the sensor to be diverted to a dummy TIA (e.g., dummy TIA 112, 210, 314) (block 408). The calibration may be performed via a control gain reduction switch, which may be analog or digital. In some aspects, the portion of the current diverted may be proportional to the extent that the current output from the sensor exceeds the predetermined threshold. If, for example, where they may be multiple thresholds, the portion may be proportional to the extent that the current exceeds the highest threshold (e.g., before the current breaks a higher threshold).

In some embodiments, the control gain reduction switch may be an n-bit digital control gain reduction switch or other suitable switch, regulator, attenuator, or control device. The portion of the current output from the sensor that is diverted may be discretely proportional to an extent that the current output from the sensor exceeds the predetermined threshold. For example, the portion of the current diverted to the current bleeding path 110, 208 can be one of n discrete levels. In some aspects, n may be five (e.g., corresponding to a 5-bit digital control gain reduction switch 214 shown in FIG. 2).

The control gain reduction switch may be adjusted, for example, to allow greater or lesser portions of current to flow to the dummy TIA 112, 210, 314 (e.g., via current bleeding path 110, 208). For example, the control gain reduction switch may be configured, using a digital to analog controller, to allow a user to input how much of the excess current should be diverted through the current bleeding path. In some embodiments, there may be multiple current bleeding paths leading to multiple dummy TIA, and a control gain reduction switch may be used to dial an appropriate portion of the excess current to be diverted to each current bleeding path.

At block 410, the system may divert the calibrated portion of the current to the dummy TIA (e.g., dummy TIA 112, 210, 314). It is contemplated that, for a given amount of current output from the sensor and diverted to the main TIA and the dummy TIA, an impedance of the main TIA may match (e.g., to a predetermined tolerance level) an impedance of the dummy TIA. In some aspects, the impedance of the dummy TIA may be less than the impedance of the main TIA (e.g., to reduce power consumption). Also or alternatively, for a given amount of current output from the sensor and diverted to the main TIA and the dummy TIA, the power consumed by the dummy TIA may be less than the power consumed by the main TIA.

Figure 5:
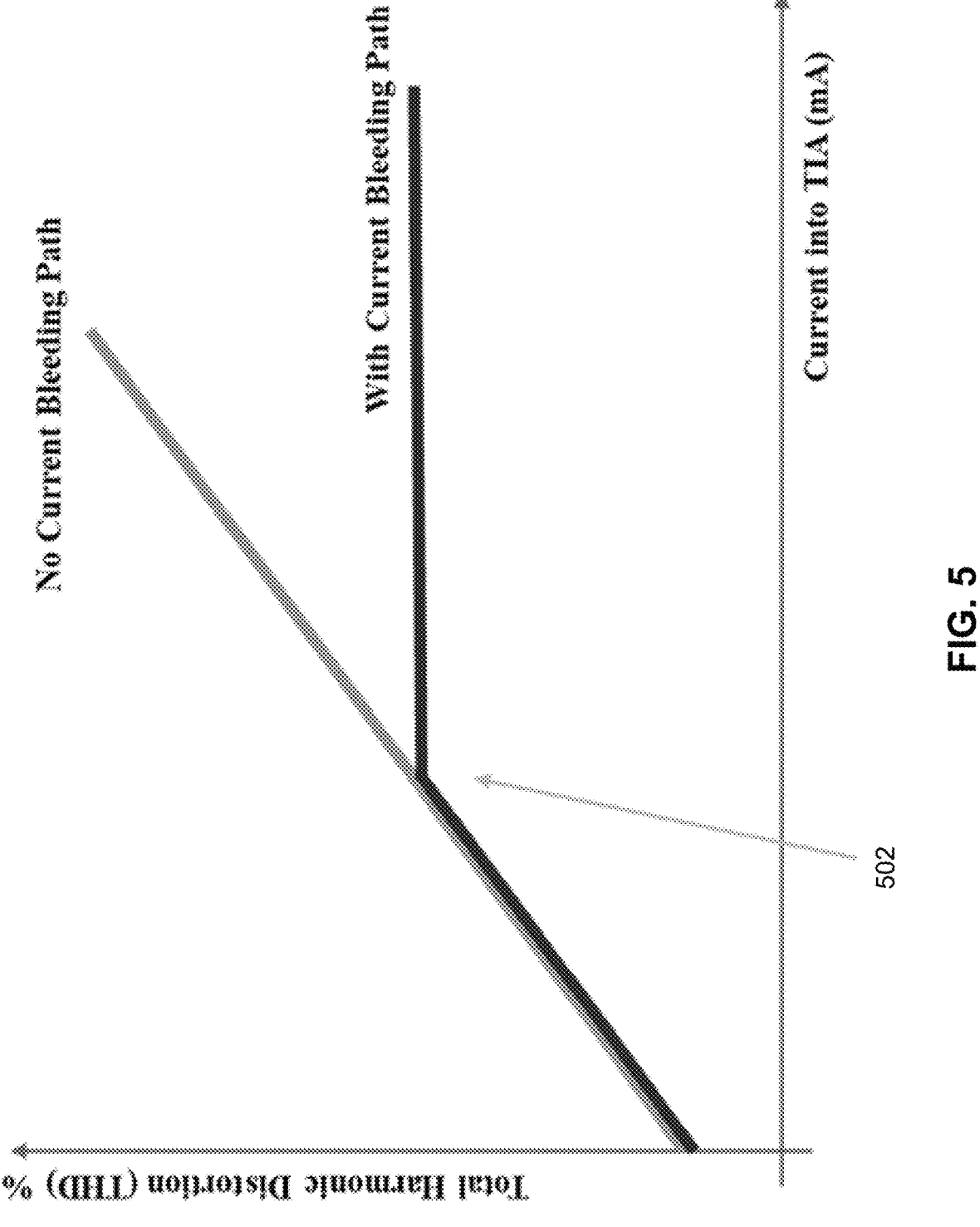
FIG. 5 is a graph showing reduction in total harmonic distortion and non-linearity through the use of current bleeding path and dummy/auxiliary TIA in accordance with one or more aspects of the disclosure.

Refer now to FIG. 5, which is a graph showing how the use of a current bleeding path such when connected to auxiliary or dummy TIA reduces nonlinearity, in accordance with one or more aspects of the disclosure. Specifically, FIG. 5 plots the total harmonic distortion (THD) along the vertical axis versus the current output directed along a bleeding path or channel away from the main TIA (e.g., "current into TIA") such that THD is decreased for the main TIA. The total harmonic distortion, which is expressed in FIG. 5 as a percentage, is an estimation of nonlinearity in the output signal from the TIA and the additional unwanted non-harmonic signals present. Two data sets are plotted as shown. The first data set corresponds to a first line for conventional TIA devices ("no current bleeding path"). The second data set includes a first section that tracks the first data set until it diverges at point 502 with a second section including a horizontal line (labeled "With Current Bleeding Path") for a TIA device, system, and technique as discussed herein. The first line, which represents THD and nonlinearity correlated therewith for conventional TIA devices as the current flowing into the TIA is increased, shows that the nonlinearity continues to increase with increasing current.

As previously discussed, the increase in nonlinearity shows that conventional TIA may not be suitable for high dynamic current ranges. However, with respect to the second data set that includes a current bleeding path connected to the main TIA and an auxiliary or dummy TIA, FIG. 5 shows that after the current flowing to the main TIA reaches a predetermined threshold 502, the THD and associated nonlinearity no longer increases. The cap or limiting of THD value increases at the main TIA results from excess current be directed away from the main TIA to the auxiliary or dummy TIA. As previously discussed, when the predetermined threshold 502 is reached, the dummy or auxiliary TIA 112, 210, 314 (and associated current bleeding path) can be activated or switched, allowing excess current to be diverted into the dummy or auxiliary TIA 112, 210, 314 (e.g., via the current bleeding path). Furthermore, by designing the dummy TIA as a scaled down version of the main TIA (with matching or lower impedance), power consumption may also be decreased.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

In most embodiments, a processor may be a physical or virtual processor. In other embodiments, a virtual processor may be spread across one or more portions of one or more physical processors. In certain embodiments, one or more of the embodiments described herein may be embodied in hardware such as a Digital Signal Processor DSP. In certain embodiments, one or more of the embodiments herein may be executed on a DSP. One or more of the embodiments herein may be programmed into a DSP. In some embodiments, a DSP may have one or more processors and one or more memories. In certain embodiments, a DSP may have one or more computer readable storages. In many embodiments, a DSP may be a custom designed ASIC chip. In other embodiments, one or more of the embodiments stored on a computer readable medium may be loaded into a processor and executed.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

Where a range or list of values is provided, each intervening value between the upper and lower limits of that range or list of values is individually contemplated and is encompassed within the disclosure as if each value were specifically enumerated herein. In addition, smaller ranges between and including the upper and lower limits of a given range are contemplated and encompassed within the disclosure. The listing of exemplary values or ranges is not a disclaimer of other values or ranges between and including the upper and lower limits of a given range.

The use of headings and sections in the application is not meant to limit the disclosure; each section can apply to any aspect, embodiment, or feature of the disclosure. Only those claims which use the words "means for" are intended to be interpreted under 35 USC 112(f). Absent a recital of "means for" in the claims, such claims should not be construed under 35 USC 112. Limitations from the specification are not intended to be read into any claims, unless such limitations are expressly included in the claims.

Embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, embodiments may take the form of a computer program product embodied in one or more computer readable medium(s) having computer readable program code embodied thereon.

What is claimed is:

1. A system for maintaining low voltage and low power in a transimpedance amplifier (TIA), the system comprising:
   a sensor;
   a main TIA comprising a front end stage, a detector, and a back end stage,
      wherein the front end stage is configured to receive a current output from the sensor,
      wherein a received signal strength indicator (RSSI) at the detector is used to monitor the current output from the sensor,
      wherein the back end stage is configured to convert the current output to an output voltage; and
   a dummy TIA coupled to the sensor, wherein the dummy TIA diverts the current output from the sensor when the current output exceeds a first predetermined threshold, and wherein comparing the RSSI to a second predetermined threshold indicates whether the current output exceeds the first predetermined threshold.

2. The system of claim 1, wherein the sensor comprises a photodetector.

3. The system of claim 1, wherein the detector comprises one or both of:
   a root mean square (RMS) amplitude detector, or
   a peak amplitude detector.

4. The system of claim 1, wherein the current output from the sensor exceeds the predetermined threshold when the RSSI reading is below a second predetermined threshold.

5. The system of claim 1, wherein the main TIA further comprises a main signal path, wherein the main signal path transfers the current output from the sensor to the front end stage of the TIA when the current output from the sensor does not exceed the predetermined threshold.

6. The system of claim 1, wherein the dummy TIA comprises a second front end stage and a current bleeding path, wherein the current bleeding path diverts the current output from the sensor to the second front end stage when the current output from the sensor exceeds the predetermined threshold.

7. The system of claim 6, wherein the dummy TIA further comprises a control gain reduction switch coupled to the current bleeding path.

8. The system of claim 7, wherein, when the current output from the sensor exceeds the predetermined threshold, the control gain reduction switch calibrates an extent of the current output diverted to the second front end stage.

9. The system of claim 8, wherein the extent of the current output diverted is proportional to an extent that the current output from the sensor exceeds the predetermined threshold.

10. The system of claim 8, wherein the control gain reduction switch is an n-bit digital control gain reduction switch, wherein the extent of the current output diverted is discretely proportional to an extent that the current output from the sensor exceeds the predetermined threshold, wherein the extent of the current output can be one of n discrete levels.

11. The system of claim 7, wherein the control gain reduction switch is controlled via a digital to analog converter (DAC).

12. The system of claim 1, wherein, for a given amount of current output from the sensor and diverted to each of the main TIA and the dummy TIA, an impedance of the main TIA matches, to a predetermined tolerance level, an impedance of the dummy TIA.

13. The system of claim 1, wherein, for a given amount of current output from the sensor and diverted to each of the main TIA and the dummy TIA, the impedance of the dummy TIA is less than the impedance of the main TIA.

14. The system of claim 1, wherein, for a given amount of current output from the sensor and diverted to each of the main TIA and the dummy TIA, the power consumed by the dummy TIA is less than the power consumed by the main TIA.

15. The system of claim 1, further comprising an automatic gain control (AGC) in electrical communication with the dummy TIA, wherein the main TIA further comprises a variable gain amplifier (VGA), the VGA in electrical communication with the front end stage and the back end stage, wherein the VGA is in electrical communication with the AGC, wherein the AGC comprises the detector.

16. A method for maintaining low voltage and low power in a transimpedance amplifier (TIA), the method comprising:

receiving, via a main signal path of the main TIA, a current output from a sensor;

converting, by the main TIA, the current output from the sensor to an output voltage;

determining that the current output from the sensor is above a predetermined threshold; and diverting, responsive to the current output from the sensor being above the predetermined threshold, the current output from the sensor to a dummy TIA via a current bleeding path coupled to the sensor, wherein the dummy TIA comprises a control gain reduction switch coupled to the current bleeding path.

17. The method of claim 16, further comprising, after the current output from the sensor is determined to be above the predetermined threshold:

calibrating, via the control gain reduction switch, an extent of the current being diverted to the dummy TIA.

18. The method of claim 17, wherein the extent of the current being diverted is proportional to an extent that the current output from the sensor exceeds the predetermined threshold.

19. The method of claim 17, wherein the control gain reduction switch is an n-bit digital control gain reduction switch, wherein the extent of the current being diverted is proportional to an extent that the current output from the sensor exceeds the predetermined threshold, wherein the extent of the current is one of n discrete levels.

20. The method of claim 16, wherein the impedance of the TIA matches, to a predetermined tolerance level, an impedance of the dummy TIA.

* * * * *